US005214708A

United States Patent [19]

McEachern

[11] Patent Number: 5,214,708

[45] Date of Patent: May 25, 1993

[54] SPEECH INFORMATION EXTRACTOR

[76] Inventor: Robert H. McEachern, 2804 Clove La., Edgewater, Md. 21037

[21] Appl. No.: 807,229

[22] Filed: Dec. 16, 1991

[51] Int. Cl.[5] .......................... G10L 5/00; H03D 3/00

[52] U.S. Cl. ....................................... 381/48; 381/30; 381/37; 381/49; 329/315; 329/347

[58] Field of Search ....................... 381/30, 31, 36–40, 381/48–50; 329/315, 321, 327, 335, 340, 347, 348, 349

[56] References Cited

U.S. PATENT DOCUMENTS

| | | | |
|---|---|---|---|
| 4,001,702 | 1/1977 | Kaufman | 329/340 |
| 4,492,926 | 1/1985 | Kusakabe et al. | 329/349 |
| 4,499,605 | 2/1985 | Garskamp | 329/340 |
| 4,864,591 | 9/1989 | Nowell | 329/347 |
| 4,885,546 | 12/1989 | Araki | 329/347 |
| 4,928,068 | 5/1990 | Main | 329/315 |

OTHER PUBLICATIONS

Eye, Brain, and Vision, David H. Hubel, Scientific American Library, 1988, pp. 182–189.
Speech Communication Human and Machine, D. O'Shaughnessy, Addison–Wesley Publishing Company, pp. 222–225.
Wavelets And Signal Processing, O. Rioul et al, IEEE SP Magazine, Oct. 1991, pp. 14–38.
Pitch Perception And The Segregation And Integration Of Auditory Entities, W. Hartman, Chapter 21, Offprints from Auditory Functionin, 1988, pp. 623–645.
Hearing A Mistuned Harmonic In An Otherwise Periodic Complex Tone, W. Hartmann, J. Acoust. Soc. Am. 88(4), Oct. 1990, pp. 1712–1724.
Wavelet Propagation And Sampling Theory, Morlet et al, Geophysics, vol. 47, No. 2, Feb. 1982, pp. 203–221 (p. 206).
Filter Technique Offers Advantages For Instantaneous Frequency Measurement, L. Chappell, MSN & CT Jun. 1986, pp. 112–117.

*Primary Examiner*—Dale M. Shaw
*Assistant Examiner*—Kee M. Tung
*Attorney, Agent, or Firm*—Foley & Lardner

[57] ABSTRACT

A method and apparatus for extracting information from human speech are dislosed. A speech signal is received into a bank of bandpass filters and the instantaneous amplitude modulation and frequency modulation of each harmonic in the speech waveform is determined. A logarithm of the instantaneous frequency of the speech fundamental frequency is determined, for example, by computing a weighted average of the frequency modulations of the harmonics. An output signal is formed having the logarithm of the frequency of the thus determined speech fundamental and the logarithms of the amplitude modulation for the ten lowest frequency speech harmonics and/or the speech envelope.

33 Claims, 6 Drawing Sheets

| Filter No. | (Hz) | Freq / 27.5 |
|---|---|---|
| 1 | 27.50 | 1.00 |
| 2 | 29.14 | 1.06 |
| 3 | 30.87 | 1.12 |
| 4 | 32.70 | 1.19 |
| 5 | 34.65 | 1.26 |
| 6 | 36.71 | 1.33 |
| 7 | 38.89 | 1.41 |
| 8 | 41.20 | 1.50 |
| 9 | 43.65 | 1.59 |
| 10 | 46.25 | 1.68 |
| 11 | 49.00 | 1.78 |
| 12 | 51.91 | 1.89 |
| 13 | 55.00 | 2.00 |
| 14 | 58.27 | 2.12 |
| 15 | 61.74 | 2.24 |
| 16 | 65.41 | 2.38 |
| 17 | 69.30 | 2.52 |
| 18 | 73.42 | 2.67 |
| 19 | 77.78 | 2.83 |
| 20 | 82.41 | 3.00 |
| 21 | 87.31 | 3.17 |
| 22 | 92.50 | 3.36 |
| 23 | 98.00 | 3.56 |
| 24 | 103.83 | 3.78 |
| 25 | 110.00 | 4.00 |
| 26 | 116.54 | 4.24 |
| 27 | 123.47 | 4.49 |
| 28 | 130.81 | 4.76 |
| 29 | 138.59 | 5.04 |
| 30 | 146.83 | 5.34 |
| 31 | 155.56 | 5.66 |
| 32 | 164.81 | 5.99 |
| 33 | 174.61 | 6.35 |
| 34 | 185.00 | 6.73 |
| 35 | 196.00 | 7.13 |
| 36 | 207.65 | 7.55 |
| 37 | 220.00 | 8.00 |
| 38 | 233.08 | 8.48 |
| 39 | 246.94 | 8.98 |
| 40 | 261.63 | 9.51 |
| 41 | 277.18 | 10.08 |
| 42 | 293.66 | 10.68 |
| 43 | 311.13 | 11.31 |
| 44 | 329.63 | 11.99 |

SPEECH INFORMATION EXTRACTOR

BACKGROUND OF THE INVENTION

1. Field of the Invention

The invention relates to methods and apparatus for extracting the information content of audio signals, in particular audio signals associated with human speech.

2. Related Art

Conventional devices for extracting the information content from human speech are plagued with difficulties. Such devices, which include voice activated machines, computers and typewriters, typically seek to recognize, understand and/or respond to spoken language. Speech compressors seek to minimize the number of data bits required to encode digitized speech in order to minimize the cost of transmitting such speech over digital communication links. Hearing-aids seek to augment the hearing impaired's ability to extract information from speech and thus better understand conversations. Numerous other speech interpreting or responsive devices also exist.

As disclosed herein, the difficulties encountered by these devices and their resulting poor performance stem from the fact that they incorporate principles of operation that are wholly unlike the operating principles of the human ear. Since such devices fail to incorporate an information extraction principle similar to that found in the ear, they are incapable of extracting and representing speech information in an efficient manner.

Chappell in "Filter Technique Offers Advantages for Instantaneous Frequency Measurement" published in Microwave System News and Communications Technology, June, 1986, discloses the basic concept of channelized filter discriminators or ratio detectors. Chappell applies the technique to measuring the frequency of individual radar pulses rather than speech and does not address measurement of combination of harmonics for frequency diversity processing. In addition, Chappell uses butterworth filters with a non-linear frequency discriminator curve rather than Gaussian filters, as is disclosed herein, with a perfectly linear discriminator curve or Gaussian/exact log discriminator curve.

Morlet, et al., in "Wavelet Propagation and Sampling Theory" published in Geophysics in 1982, discloses a filter bank with Gaussian filters equally spaced along a logarithmic frequency axis. The system is applied to seismic waves, rather than speech and does not address the measurement and combination of harmonics for frequency diversity processing.

Hartman in "Hearing a Mistuned Harmonic in an Otherwise Periodic Complex Tone", published in 1990 in the Journal of the Acoustical Society of America, and in Chapter 21 of *Auditory Function* "Pitch Perception and the Segregation and Integration of Auditory Entities" describes the abilities of the auditory system to recognize and distinguish different sounds, but not how this is accomplished. The use a frequency discrimination process to measure harmonic frequencies and "pitch meter" that fits harmonic templates to resolve frequency components using conventional spectral analysis, is also disclosed. However, none of these references can account for observed functional behavior of the human ear. In addition, none of the references discloses that the ear is primarily a modulation detector rather than a general purpose sound detector, speech modulation uses a hybrid AM/FM signaling scheme with frequency diversity via harmonically related carriers. The reasons why ones perception of pitch is logarithmic is that proper FM demodulation of harmonics requires band pass filters with band widths proportional to their center frequencies in a logarithmic relationship. Finally, there is no disclosure of a ratio detector.

Information encoded in signals can be extracted in numerous ways. Usually, the optimal way to extract information from signals is to employ the same approach used for encoding the information. The human ear does not appear to employ conventional data processing methods of extracting information from sound signals, such as methods using Fourier coefficients, Wavelet transform coefficients, linear prediction coefficients or other common techniques dependent on measurements of the sound signals themselves.

Human speech typically contains only about 100 bits of information per second of speech. Yet, when speech is digitized at an 8,000 sample/second rate, the Nyquist limit for telephone (toll) quality speech, with a 12-bit analog-to-digital converter, nearly 100,000 bits of data are obtained each second. Therefore, it should be possible to compress speech data by factors of up to 1000, in order to reduce the number of data bits, and still preserve all of the information. Despite intense research over many decades, the best compression factors achieved for telephone quality speech are only about 20, such as that obtained by the 4800 bits/second code-excited linear prediction (CELP) technique. Worse still, speech compression techniques with high compression factors are extremely complex and require a great deal of computing in order to implement them.

The difficulties encountered in attempting to produce machines to compress or otherwise process speech signals is a direct result of a "which came first, the chicken or the egg" type of problem associated with audio perception. Information from speech cannot be extracted unless it is first known how the information is encoded within speech signals. On the other hand, understanding how the information is encoded is difficult if there is no practical means for recovering it. This situation has not significantly changed in more than one hundred years, since Herman von Helmholtz tried, and failed, to explain how human hearing functions in terms of "resonators". Since that time, many theories of audio perception have been published, but none of them can account for most of the observed, perceptual behavior of the auditory system. As a direct result of this lack of theoretical understanding, no machines have ever been built that perform in a manner remotely similar to the ear.

Thus, conventional approaches are often inaccurate and inefficient. The invention disclosed herein solves these problems by employing techniques more compatible with the operation of the human auditory system.

OBJECTS OF THE INVENTION

In view of the above-discussed limitations of the related art an object of the invention is to provide a superior speech information extractor that functions in a manner similar to the functioning of the human auditory system and possesses similar acoustical performance.

It is still another object of the invention to provide a speech information extractor that is relatively insensitive to amplitude and phase distortion, noise, interference and the pitch of speech.

It is still another object of the invention to provide a speech information extractor which exhibits a logarithmic response similar to that of the human ear to both the intensity and frequency of input sounds.

SUMMARY OF THE INVENTION

The above and other objects of the invention are achieved by a method and apparatus based on a model of the ear not as a general purpose sound analyzer, but rather as a special purpose modulation analyzer. Following this approach, the invention is specifically designed to extract amplitude and frequency modulation information from a set of harmonically spaced carrier tones, such as those produced by the human voice and musical instruments. By incorporating "a priori" knowledge of the peculiar characteristics of such sounds, both the ear and the invention herein effectively exploit a loop-hole in the "Uncertainty Principle." This enables the invention and the ear to measure the frequency modulations of the speech harmonics more accurately than conventional speech processing techniques.

The invention employs a frequency diversified, instantaneous frequency and amplitude (FM and AM) representation of sound information. By exploiting an uncertainty principle loop-hole, the technique typically enables the system to measure frequency information 100 times more accurately than conventional Fourier analysis and related methods. Furthermore, the method of the invention is consistent with the ear's logarithmic encoding of frequency, its insensitivity to amplitude distortion, phase distortion, small frequency shifts such as those encountered in mis-tuned, single-sideband radio transmissions, and speech information extraction that is independent of pitch and thus largely independent of the speaker.

The invention operates by extracting frequency and amplitude characteristics of individual harmonics of a speech signal using frequency discrimination and amplitude demodulation. Predetermined sets of the frequency modulations of the individual harmonics are then summed in order to obtain an average frequency modulation. In a preferred embodiment, the invention has a receiver with a plurality of individual adjacent filters separated by a predetermined frequency ratio. Logarithms of signal amplitudes in adjacent filters are obtained, for example, using Gaussian filters and a logarithmic amplifier, and then subtracted, thus forming a ratio detector. A weighted sum of the harmonics of fundamental frequencies is then calculated to form an output signal. The output signal formed is a single channel log FM signal selected from the channel with the highest log AM. Weighting can be accomplished by giving highest weights to those frequencies which are integer multiples of measured fundamentals and lower weight to other signals in the filters encompassing the harmonics. This reduces the effects of noise or spurious signals. The output signal formed can then be buffered, digitized or otherwise processed for use in speech interpreting systems, as desired.

Specifically, the invention incorporates a ratio detector for FM demodulation of radio signals, a Gaussian (Gabor) function filter-bank with a logarithmic frequency axis, frequency diversity signaling, and scale invariance resulting from logarithmic encoding.

BRIEF DESCRIPTION OF THE DRAWINGS

The above and other objects of the invention are achieved by the method and apparatus described in detail below with reference to the drawings in which.

FIG. *6a* illustrates a speech wave form v. time and the log (instantaneous amplitude) and log (instantaneous frequency) detected from a filter bank.

FIG. *6b* is a conventional Fourier spectrograph of a few seconds of speech.

Figure 7:
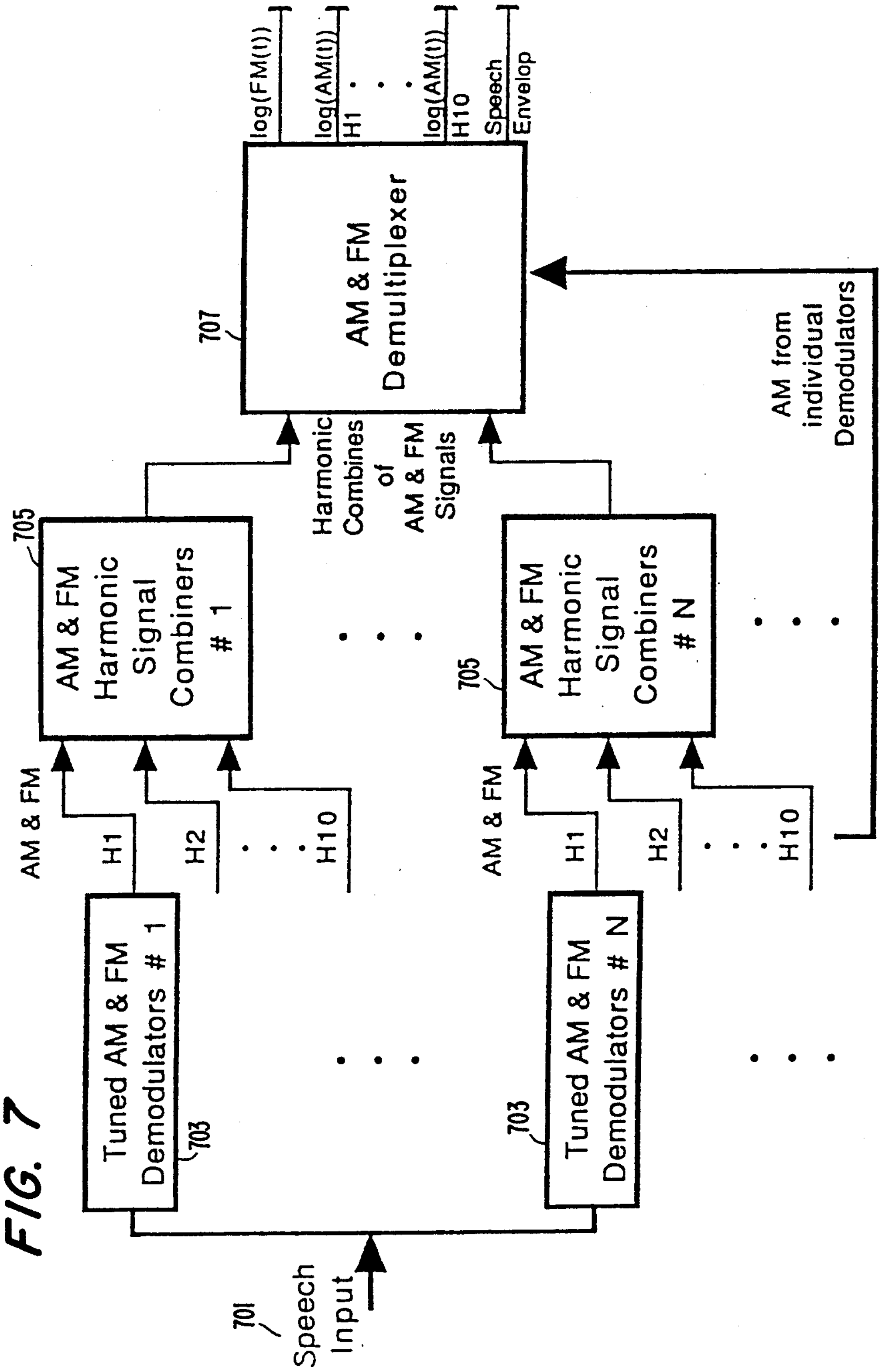

FIG. 7 is a block diagram of the invention.

DETAILED DESCRIPTION OF THE PREFERRED EMBODIMENTS

Both the human visual and auditory processing systems are highly constrained by the fact that the receptors of these systems respond directly only to the logarithms of the intensity of signals within various bands of frequency, and not the signals themselves. The human visual and auditory systems do not appear to perform Fourier analysis or any other type of conventional signal processing, since these techniques require, as inputs, measurements of the signals themselves rather than the log of the intensity of the signal. It is known that the human eye retina extracts high-resolution frequency (color) information from just three log (intensity) measurements made in three different frequency bands with three types of cone cells. First proposed by Thomas Young almost two hundred years ago, to this day researchers have never fully understood how it is accomplished. See pages 187–188 of the 1988 work *Eye, Brain and Vision,* by Nobel Prize winner David Hubel. One approach is to consider the operation of this phenomenon as a ratio detector. The existence of a similar phenomenon in human audio processing is hereby postulated. As disclosed herein, that phenomenon can then be exploited in speech processing systems. Unlike other techniques, the projected performance of this technique is virtually identical to the experimentally derived acoustical performance of the human auditory system.

Figure 1A:
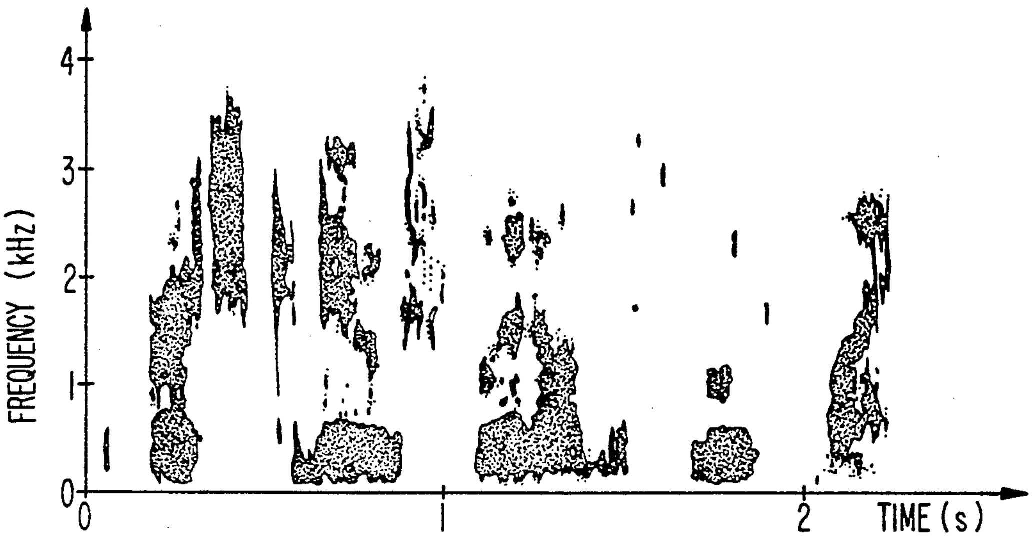
FIG. 1A is a spectrogram of the sentence "The birch canoe slid on the smooth planks" based on Fourier analysis with wide filter bandwidths.
Figure 1B:
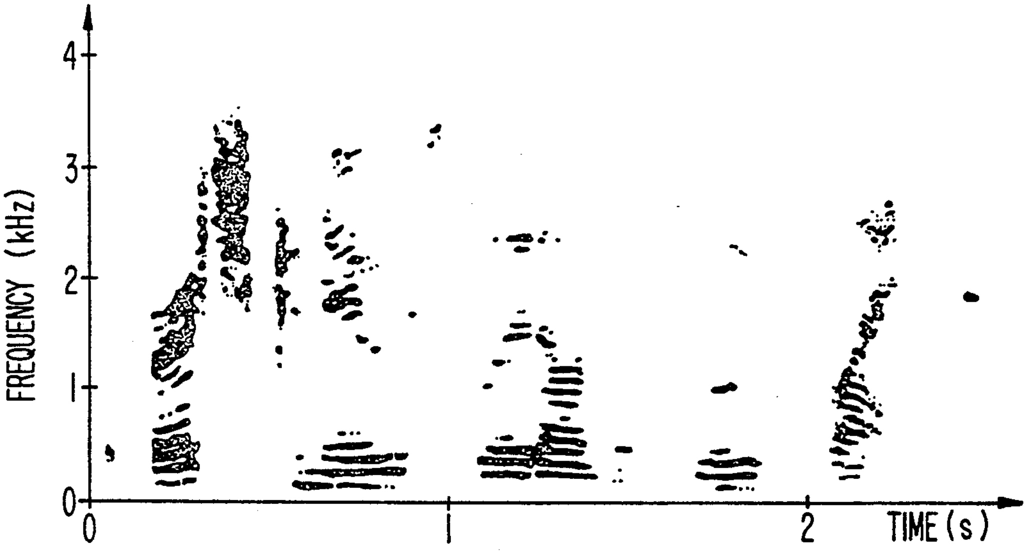
FIG. 1B is a spectrogram, as in FIG. 1A, but employing narrower bandwidth filters.
Figure 6B:
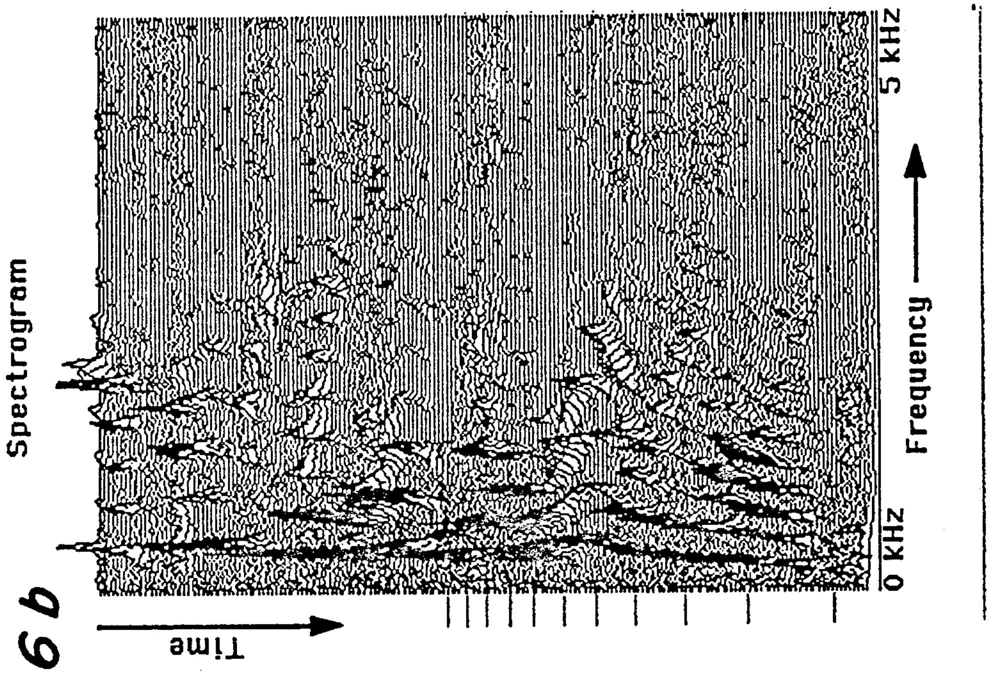
Figure 6A:
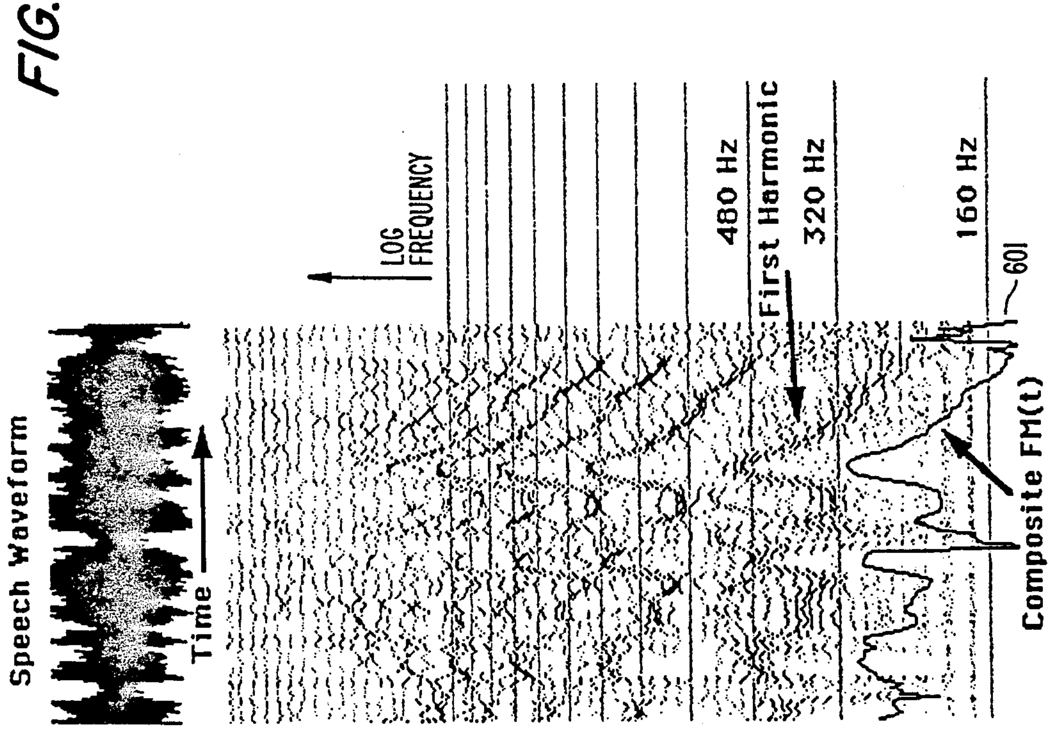

Referring to FIGS. 1A and 1B, two spectrograms of the same spoken sentence are presented. The spectrogram in FIG. 1A was made using conventional Fourier-type analysis with wide filter bandwidths and is typical of the types of spectrograms found in the speech literature. FIGS. 1A and 1B are reproductions of FIGS. 6.9A and 6.9B from "Speech Communication-Human and Machine" by D. O'Shaughnessy published in 1987. The spectrogram in FIG. 1B, was made using narrower bandwidth filters and clearly shows the voice harmonics which are characteristic of speech. One seldom encounters very high resolution spectrograms in the literature because of the limitations imposed by the Fourier uncertainty principle. The uncertainty principle states that the product of the frequency and temporal resolutions in a filter-bank cannot be less than some minimum value. Consequently, a filter-bank with high resolution in frequency has a low resolution in time, making it difficult to resolve the short gaps between spoken words etc.

However, if one knows a priori that only a single tone is present within the bandwidth of any one filter, or arranges for that to be the case, then the uncertainty principle does not apply. Such techniques have been exploited previously by radar warning receivers.

The structure of human speech signals and the human auditory filter-bank can be modeled using such an approach by arranging for each frequency and amplitude modulated harmonic with a significant power level to lie within a separate filter. Hence, the modulation information on each individual harmonic, including both frequency and timing information, can be extracted with an accuracy that exceeds, by 2-3 orders of magnitude, the limitations imposed by the uncertainty principle on conventional transform-based analysis. Furthermore, all of this modulation information can be extracted from just the measurements of the logarithm of the intensity of each harmonic. Thus, even though the ear responds to sound signals spanning a dynamic range of twelve orders of magnitude, all the encoded information can be encoded into output signals over only a single order of magnitude. This compression of information has profound implications for all audio processing applications.

Identifying and processing simultaneously occurring acoustic signals and extracting information from them is a bit like having the pieces from several jig-saw puzzles, all mixed into one big pile. First, it is necessary to sort out the pieces from each puzzle. Then each puzzle in turn must be assembled, allowing the picture formed by each puzzle to be completed. One technique to accomplish this is grouping together pieces that bear a "constant" relationship to one another. For example, pieces with the same distinctive color, or the same flat edge (indicating a puzzle border), are separated from the pile and grouped together. Successfully accomplishing this requires two different capabilities. The first is the capability of making "precise measurements", so that we can distinguish between slight color variations and edge "flatness" variations. The second required capability is the ability to detect correlations between different precise measurements.

The puzzles represented by acoustic signals can be sorted in a similar fashion, by making precise measurements of instantaneous amplitudes and frequencies, and detecting correlations between various measurements. A filter bank, composed of many narrow-bandwidth, AM detectors, is one way to detect signals in noise. Since each detector is tuned to a different frequency band, to some extent, simply noting which detectors actually detect signals provides a crude measure of the signal frequencies. However, this crude measure can be improved.

Figure 2:
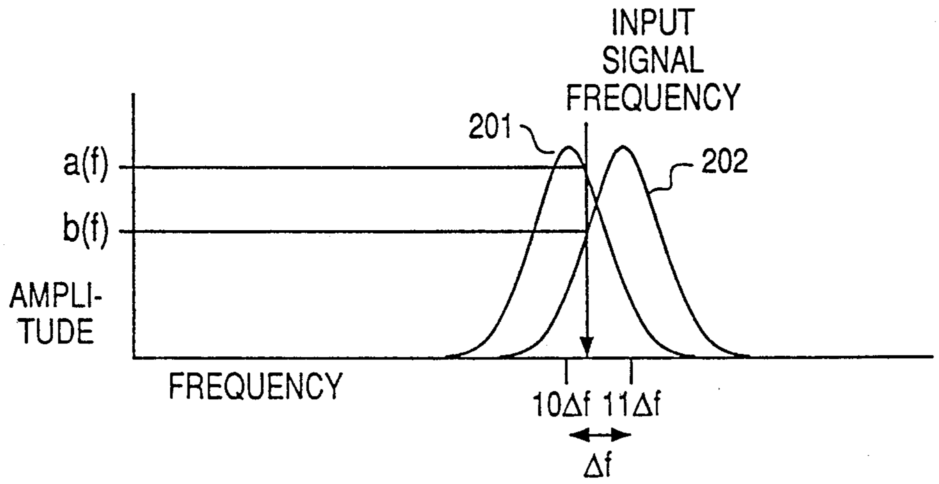
FIG. 2 illustrates the frequency response of two adjacent Gaussian band pass filters used to form a ratio detector capable of measuring the instantaneous frequency of any signal within the passbands of the filters.

The amplitude vs. frequency response of two "Gaussian" band-pass filters 201, 202, is depicted in FIG. 2. The filter pass-bands are centered at frequencies NΔf and (N+1)Δf, where Δf is equal to the spacing between the two filters and also is a measure of the filter's bandwidth ("N" stands for the N'th filter in a series of evenly spaced filters, called a filter bank).

If a sinusoidal signal, with amplitude "A" and frequency "f" is passed through both of these filters, the output from each of the two filters is an attenuated copy of the signal, with frequency "f" and amplitudes a(f), and b(f), which are Gaussian functions of frequency. It should be noted that other amplitude vs. frequency responses could be used. The reason for selecting a Gaussian response is that the Gaussian is an optimal response in the sense that it has the minimum possible time-bandwidth product.

$$a(f)=Ae^{-(f-N\Delta f)2/\Delta f^2}\ b(f)=Ae^{-(f-(N+1)\Delta f)2/\ \Delta f^2}.$$

If no other signal is present within the pass-bands of the two filters, then these two amplitudes can be used to accurately determine the instantaneous frequency of the input signal, assuming that it is slowly varying, as is the case for speech. Taking the natural logarithm of the ratio a(b)/b(f) yields:

$$ln[a(f)/b(f)]=-(f-N\Delta f)^2/\Delta f^2+(f-(N+1)\Delta f)^2/\Delta f^2$$

Note that this cancels out amplitude variations by forming a ratio of the two filter outputs. Even if the input signal has a time-varying amplitude, the output is still independent of the amplitude. A device which performs this function is called a ratio detector and has long been used (though not with Gaussian filters) in FM radio receivers, as is known to the ordinarily skilled artisan.

Expanding the numerator of this expression yields:

$$-f^2+2fN\Delta f-(N\Delta f)^2+f^2-2f(n+1)\Delta f+N^2\Delta f^2+2N\Delta f^2+\Delta f^2=-2f\Delta f+2N\Delta f^2+\Delta f^2 \text{ so: }$$
$$(\Delta f/2)ln[a(f)/b(f)]=-f+(N+\tfrac{1}{2})\Delta f$$

Solving for the frequency f yields $$f=(N+\tfrac{1}{2})\Delta f-(\Delta f/2)ln[a(f)/b(f)], \text{ or: }$$

$$f=N\Delta f+\Delta f/2-(\Delta f/2)\{ln[a(f)]-ln[b(f)]\}$$

The first term in this expression, NΔf, is simply the center frequency of the first filter. The second term equals half the spacing between adjacent filters, and the last term is proportional to the difference between the logarithm of the output amplitudes (intensity) of the two adjacent filters. Note that when a(f)=f(f), which occurs when f is midway between the two filters, this formula correctly indicates that f=NΔf+Δf/2.

When only one signal is present within the pass-bands of the two filters, according to the above equation it is possible to determine the instantaneous frequency of the signal, regardless of the signal amplitude, as simply a function of the difference between the "Log detected" output amplitudes from the filters. Given a sufficient signal-to-noise ratio, the instantaneous frequency can readily be determined to an accuracy that is a very small fraction of the bandwidth to the filters, even for very short duration signals. Furthermore, if the filters have relatively small bandwidths in comparison to the full audio frequency range (as would be the case for optimal signal detection) than most filters in the filter band will have only a single component of a signal (such as a harmonic) within them, most of the time.

The human ear appears to exhibit a logarithmic response to signal amplitude, enabling it to accommodate a very wide range of signal amplitudes. Using the technique described above, at very little additional cost above that required to construct a "log AM detected" filter bank (optimized for detecting narrow-band signals over a wide range of amplitudes), the log detected AM can be used to generate precise instantaneous frequency measurements. These are very useful for sorting out signals in order to identify and locate the signal source.

In addition to being able to isolate individual tones and accurately measure their instantaneous frequencies, this type of filter bank has another special property. As depicted in the FIG. 3, it can be used to recombine the pieces of the jig-saw puzzles, after they've been sorted out.

Figure 3:
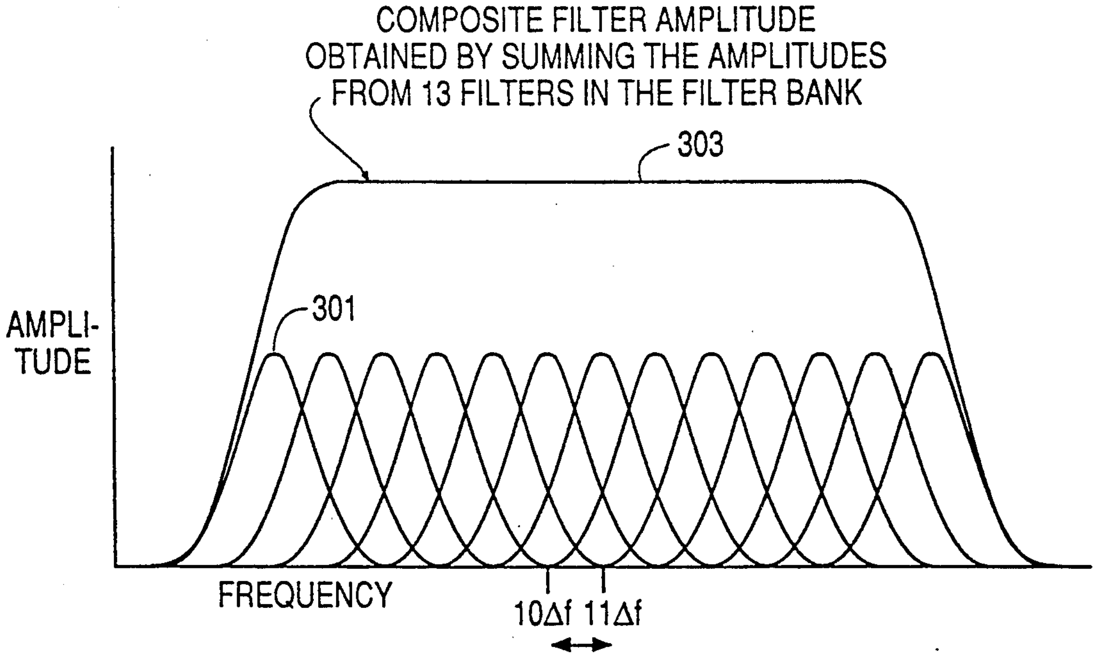
FIG. 3 shows several Gaussian band pass filters combined to form a composite filter with a wide, flat pass band.

It is possible to "synthesize" other band-pass filters by summing together the outputs of various individual filters within the filter bank. As shown in FIG. 3, by summing adjacent filter outputs (for example, filters 301), another, wider bandwidth filter can be created thereby synthesizing a filter with an ideally constant amplitude vs. frequency response 303. This is important in solving the problem of optimally filtering a signal when the signal's frequency characteristics are unknown. This type of filter bank enables the precise measurement of frequency characteristics, by synthesizing an optimal filter to remove noise and interfering signals, that effectively re-filters the signal optimally.

In other words, after pulling the signal apart and analyzing the individual pieces within each different filter of the filter bank, selected pieces (determined by exploiting correlations between precise measurements, such as the periodic frequency spacing of harmonics), can be recombined without distorting the signal in any way. In order to avoid distorting the signal when the pieces are reassembled, it must be possible to ensure that Fourier coefficients of the reconstructed signal are the same as (or proportional to) that of the original input. The fact that a synthesized filter can be created with a "constant" amplitude vs. frequency within its band-pass says that the synthesized filter can preserve the correct amplitude proportionality.

In order to avoid distortion, however, the phase response of the output must also match that of the input. It is not sufficient that only the amplitude response be the same. By using symmetrical Finite Impulse Response (FIR) filters, the filter bank can be constructed in such a way so as to ensure that both the amplitude and phase are matched. Thus, since the Fourier coefficients are proportional, each synthesized measurement of the signal, obtained by summing the terms in its Fourier representation, will be proportional to its corresponding original input measurement.

Another aspect of audio perception is that human perception of pitch responds to the logarithm of frequency, not frequency itself. Tones that sound equally far apart (at equal intervals) are not equally spaced in frequency at all. Instead, they are equally spaced in the logarithm of frequency. This perception is so pervasive that it is far-and-away the dominant factor in the composition and appreciation of music and in tuning musical instruments. Thus, human hearing is not simply optimized to detect signals within a specific range of frequencies, it is also appears to be optimized to detect and identify certain types of modulations. It is well known that human hearing is "tuned" to the 20–20,000 Hz frequency range. However, human hearing also appears tuned to pick-up only a limited range of amplitude and frequency modulations. The fact that the ear is only sensitive to certain ranges of modulation is the reason it behaves as it does in audio function tests such as those discussed by Hartmann. This explains why we tune instruments and compose music the way we do.

It has been known since the days of ancient Greece that the differences in the pitch of musical notes played on stringed instruments correspond with finger positions on the strings that divide the strings into certain fixed lengths or "intervals" which are integer ratios of one another. Because the fundamental frequency at which a string vibrates is proportional to the length of th string, this meant that the notes of the Greek musical scale did not go up by equal steps in frequency. Instead, they went up by standard frequency ratios. Since the logarithm of a ratio equals the difference between the logarithms of the ratio's numerator and denominator, standard differences in the pitch of the notes correspond to standard differences in the logarithms of the frequencies rather than the frequencies themselves.

The fact that the ear naturally "prefers" this type of logarithmic tuning has caused considerable problems in tuning musical instruments and playing harmonies. Playing simple melodies, one note at a time, presents no difficulty. But a problem arises as soon as one attempts to play several notes of different pitches at the same time, for example, to form a chord. The problem is that "beats" may occur between either the fundamentals or the harmonics of the tones. Beats occurring at certain "beat frequencies" can be very annoying, creating what musicians call dissonance. Since the harmonics of a fundamental are equally spaced in frequency, they will never be at frequencies precisely equal to fundamentals of the other notes on a scale that is not also equally spaced in frequency, where the beat frequency would be zero, so no beating would be heard. Slight differences in frequencies between different harmonics of different notes on a logarithmically tuned scale cause the beats.

However, the human ear is sensitive to only a very limited range of beat frequencies (the frequency of an instantaneous amplitude modulation) and vibrato frequencies (the frequency of an instantaneous frequency modulation). So problems can be alleviated by making some slight compromises in tuning, and by playing only certain, restricted combinations of notes (the familiar chords) in order to avoid the worst of the dissonances. So, far from being a universal language, human music is "tuned" to precisely match the pass-bands of the instantaneous amplitude and instantaneous frequency analysis capabilities of our ears. It does not matter that hundreds of other dissonances may be present. As long as they are outside the narrow range of the modulation bandwidths perceptible by the ear's audio signal processing system, they are never heard. Apparently, the information about those dissonances is never encoded into the information sent by human audio sensors to the correlators in the brain.

This emphasizes several points that were noted earlier herein. First, in order to measure the instantaneous frequency of a single tone more precisely than the limit imposed by the uncertainty principle, it is necessary to arrange that only a single frequency component be present within the bandwidth of the measuring device. Second, modulated signals have non-zero bandwidths. If these bandwidths are greater than the bandwidths of the channel filters used to measure the modulations, information present within the modulations is lost. The width of the optimal filter depends on which signals one wants to optimally detect. If many of these signals were produced by vibrating sources (such as vibrating vocal chords), the signals will contain many harmonics. The filters must be sufficiently narrow that only one harmonic lies within any given filter, in order to measure the instantaneous frequency of the harmonic. On the other hand, vibrations are commonly modulated. To measure the modulations, the filters cannot be so narrow that the filter bandwidths are less than the modulation bandwidths. Finally, since the spacing of the harmonics is a function of the fundamental frequency or pitch, the bandwidths of the optimal filters must also be a function of frequency. Thus, the optimal spacing and bandwidths for the filters are signal dependent and we cannot optimize for every sound all the time.

Over millions of years, nature has apparently optimized human hearing for detecting and characterizing sounds that are rich in harmonics and have relatively narrow modulation bandwidths, such as the sound of the human voice. This is a form of a priori knowledge that has been "hard-wired" directly into the audio circuitry. By definition, if a fundamental is frequency modulated such that it changes frequency by an amount "x", then the "N"th harmonic changes frequency by an amount Nx. In other words, the bandwidth of the harmonics are proportional to the frequency of the harmonic. This is the reason for the logarithmic frequency scale. In order to measure the instantaneous frequency of each modulated harmonic, the bandwidths of the filters in the filterbank must increase in direct proportion to the center frequency to which the filter is tuned. On the other hand, if the filter bandwidths become so wide that more than one harmonic lies within a filter's pass-band, precise measurement of the instantaneous frequency will not be possible. As a result, the filters cannot be optimized to measure the instantaneous frequency of high harmonics when the frequency modulation on the fundamental has a bandwidth that is a substantial fraction of the fundamental frequency.

In the frequency range of the human voice, one would expect to see filters with bandwidths increasing approximately linearly in frequency. The bandwidths of these filters would be on the order of 10% of the center frequency to which they were tuned. If the bandwidths were much wider, it would not be possible to measure the instantaneous frequency of the higher harmonics, because more than one harmonic would occur within the filter pass-bands. If the bandwidths were much narrower, the filters would not be able to measure slight frequency modulations commonly found to occur within the frequency range of the voice. Similar principles could be applied to systems operating at other than audio speech frequencies. However, filters outside the voice frequency range could be optimized for signals other than speech.

The average speaking pitch of human voices span the frequency range 100 Hz (Bass) to 300 Hz (Soprano). The pitch range of singing voices extends from about 80 Hz to about 1050 Hz, the "high C" of the soprano. For comparison, the keys of a piano span a fundamental frequency range of 27.5–4186 Hz. Optimizing for an average speaking pitch of 200 Hz, one would expect to see the linear trend in bandwidth from about 200 Hz to at least 2000 Hz. But the trend may not continue beyond about 3500 Hz, the upper limit of frequencies passed by telephone circuits, since the voice produces little power in harmonics above that frequency.

Figure 4:
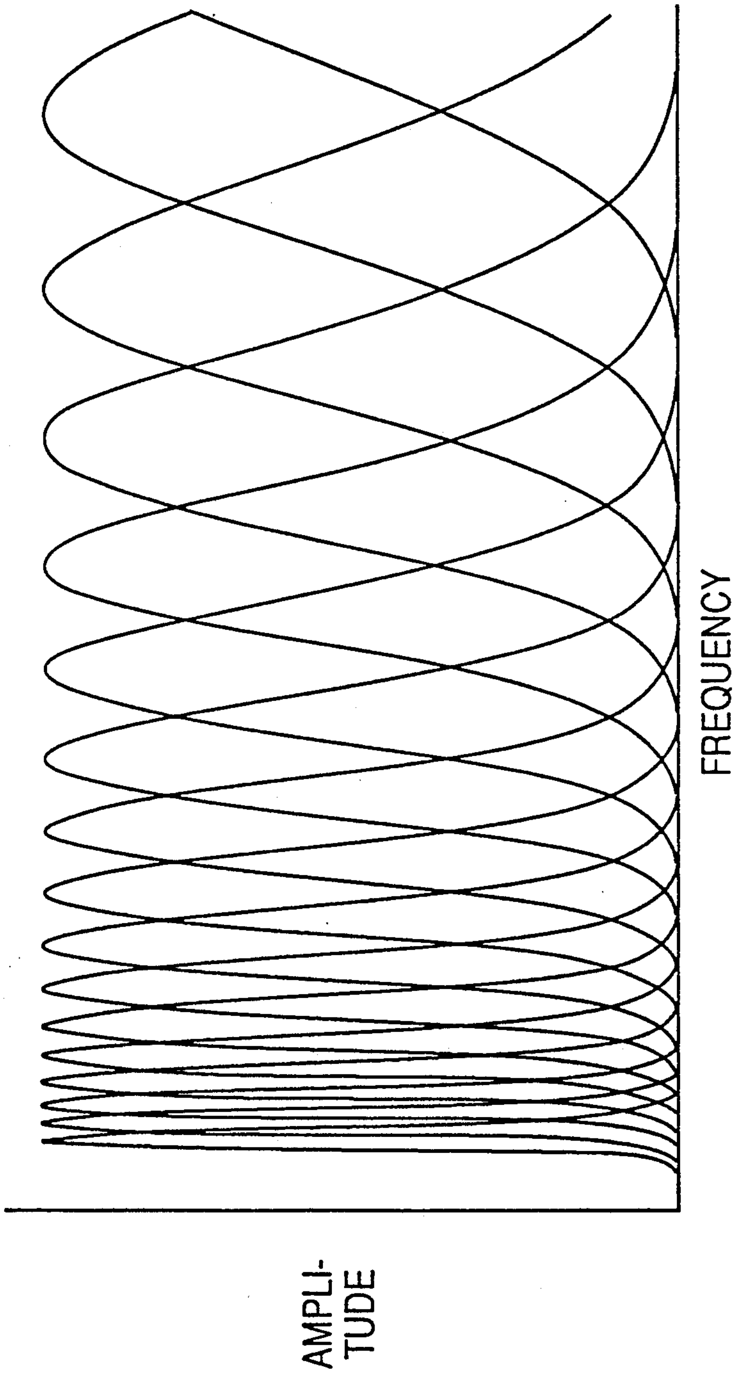
FIG. 4 illustrates the Amplitude v. Frequency response of filters in a filter bank of band pass filters, each having a Gaussian Amplitude v. log (frequency) response curve.

While it may seem that switching from a linear frequency scale to a logarithmic one would have a major impact on the design of an FM detecting filter bank, this is not the case. Replacing frequency by log (frequency/F), where F is the frequency to which the first filter in the filter bank is tuned, for the previously discussed figures and equations that describe the FM detecting filter bank, obtains a new filter bank that measures the logarithms of ratios of instantaneous frequencies rather than the instantaneous frequencies themselves. The response of these filters can be plotted on a linear frequency scale as shown in FIG. 4. FIG. 4 illustrates the amplitude vs. frequency response of filters in a filter bank consisting of band pass filters, each band pass filter having a Gaussian amplitude v. log (frequency) response. This filter bank was designed with the filters separated by one quarter of an octave each. That is, starting at any filter, moving four filters to the left or right results in a factor of two change in the center frequency of the filter.

Considerations of audio perception in humans suggests that filter functions within the ears have a somewhat finer frequency spacing, approximating one twelfth of an octave. Due to a lack of direct access and numerous subjective effects, it is difficult to accurately determine the bandwidths of human audio processing, although there is some evidence to this effect. Above 200 Hz, data collected by Plomp and Mimpen shows that two different sinusoidal tones must be separated by a frequency ratio of at least 1.18, or about a quarter of an octave in order to be heard distinctly. Since the ability to hear the tones individually implies that they lie within different filter bandwidths, the filter bandwidths must be somewhat less than 18% of the filter's center frequency. Hartmann noted that for a fundamental frequency near 200 Hz, the listener could precisely estimate the frequency of a mis-tuned harmonic, up to about the twelfth harmonic, but that there was a "beating sensation" for greater harmonics. He also reported that there appears to be an "absolute frequency limit, between 2.2 and 3.5 kHz, for the segregation of a mistuned harmonic." The beating sensation indicates that at that harmonic, the filter bandwidth is wide enough to pass significant power from more than one harmonic. The absolute frequency limit indicates that the filtering at frequencies above the range of the human voice may differ from that within this range and may have been optimized for some other purpose.

The logarithmic encoding of the AM and FM harmonics in speech signals introduces a "scale invariance" in the encoding of the information content of the signals. When different pitched notes are played on a musical instrument, the instrument can be identified by its distinctive timbre. The sounds are completely different frequencies, but somehow they convey the same identity information. In a similar manner, it is possible to identify a spoken word regardless of whether it is spoken by a deep pitched male voice or a high pitched female one. Table I illustrates the results of an audio processor computing the logarithm of each harmonic's instantaneous frequency after receiving a complex sound with four harmonics.

TABLE I

| Instantaneous Frequency | Log (Instantaneous Frequency) |
|---|---|
| f(t) | log[f(t)] |
| 2f(t) | log[f(t)] + log [2] |
| 3f(t) | log[f(t)] + log [3] |
| 4f(t) | log[f(t)] + log [4] |

The instantaneous frequency of the fundamental may be function of time, f(t). The instantaneous frequency of each harmonic is simply an integer multiple of the instantaneous frequency of the fundamental. The log operation separates the function f(t) from the harmonic number. Graphing these functions vs. time, they all look identical, except for a vertical offset. Indeed, subtracting the average value of each function from the function, i.e., high-pass filtering, produces four identical functions. Other things being equal, the output of this operation is independent of pitch.

This reveals two significant points. First, the information rate of human speech is only about 100 bits of new information per second. That is far below the Shannon capacity for the bandwidth occupied by a speech signal for a signal-to-noise ratio comparable to that of a typical telephone conversation. This suggests that human speech signaling is adapted for communicating at lower S/N ratios, where the observed information rate would be closer to the Shannon capacity. Human speech on a telephone line can be easily understood at signal-to-noise ratios hundreds of times lower than the signal-to-noise ratios required in order to understand high-speed modem signals over the same line. Being understood is an important survival characteristic. Living in a noisy environment, natural selection would favor the evolution of characteristics that enhance the ability to communicate reliably as well as rapidly. But the Shannon capacity theorem says both speed and reliability are incompatible. A low signal-to-noise ratio environment cannot support the same information transmission rate as a high S/N environment with the same bandwidth. Human speech and hearing appear have adapted to work at low signal-to-noise ratios, not high transmission rates. The redundant transmission of information strongly contributes to this characteristic.

Note that for true harmonic components, the information content of the instantaneous frequency of each harmonic is identical to the information content of the fundamental. Simultaneously transmitting the same information at multiple frequencies, known as frequency diversity signaling, has been employed in man-made devices ranging from high-frequency radio equipment to ultrasonic, auto-focus cameras. Its purpose is to ensure that the needed information will be received, even if the environment filters out some frequencies or obliterates others in noise or by destructive interference. Redundant transmission of information reduces the information rate that the bandwidth could support, but increases the reliability of communications.

The second point is that for the identification process, it is not necessary for the subsequent processing to store and utilize separate representations of spoken words for each different pitched voice or loudness level. By log transforming and removing the average value from the instantaneous amplitude and frequency measurements, the sensor can present a following processor with a representation of information that is independent of either the pitch or loudness of the input signal. The pitch and loudness information are not lost, but they have been stripped-off and reported as separate pieces of information.

This does not imply that the instantaneous frequency information from the channel filters is the only information exploited by the identification process. Note that although the information content of the instantaneous frequencies of each harmonic is identical, the information content of the instantaneous amplitudes of the harmonics may differ. For example, some harmonics may decay away faster than others. Also, the information obtained via the analysis of the reconstructed wide-band signal may be used. For example, the recognition of the timbre of an instrument is known to depend on the phase relationships between harmonics. Differences in the relative phases of harmonics of a waveform may cause the instantaneous amplitude or envelop of the wide-band waveform to differ. So the envelop may be useful for identifying waveforms with identical power spectrums, but differing phase spectrums.

The invention disclosed herein extracts information from speech by measuring the amplitude and frequency modulation (AM and FM) on individual voice harmonics. Since the bandwidths of the modulations are typically 100–1000 times smaller than the speech signal itself, the Nyquist sampling theorem guarantees that significantly fewer data bits can be used to encode the modulations than would be required to encode the speech itself. Furthermore, since the natural logarithms of the FM of the harmonics are all identical except for a constant, they can be averaged to yield a single composite FM, thereby reducing the number of bits required to encode the extracted FM information even further. From an information theory perspective, only the modulations on a signal convey information. Hence, the direct extraction of the speech modulations results in a concise representation of the speech signal's information content.

This invention also makes it possible to extract this modulation information using device technologies with limited dynamic ranges and without measuring the signal itself. Only measurements of the logarithm of the signal's intensity at the output of certain band-pass filters are required. Also, logarithmic encoding of the AM and FM further reduces the number of data bits required to encode the extracted information, as compared to a linear encoding of the same modulations.

The invention is based on a recognition that the human auditory system specifically exploits the fact that it "knows" that human speech consists of amplitude and frequency modulated harmonics. Conventional theorists believe that all of the information needed to interpret speech data lies somewhere within the speech signals themselves. The invention recognizes the principle that additional information is required in the form of a priori knowledge embedded within the human auditory system itself (or the invention), not the received signals. A system that "knows" that the signal to be processed consists of modulated harmonics can use techniques that could never be used if it did not "know" that fact. These special techniques enable the invention to extract the modulation information much more simply and accurately than any other techniques. Indeed, they can measure them so accurately that they seem to violate the uncertainty principle by more than a factor of 100.

Figure 5:
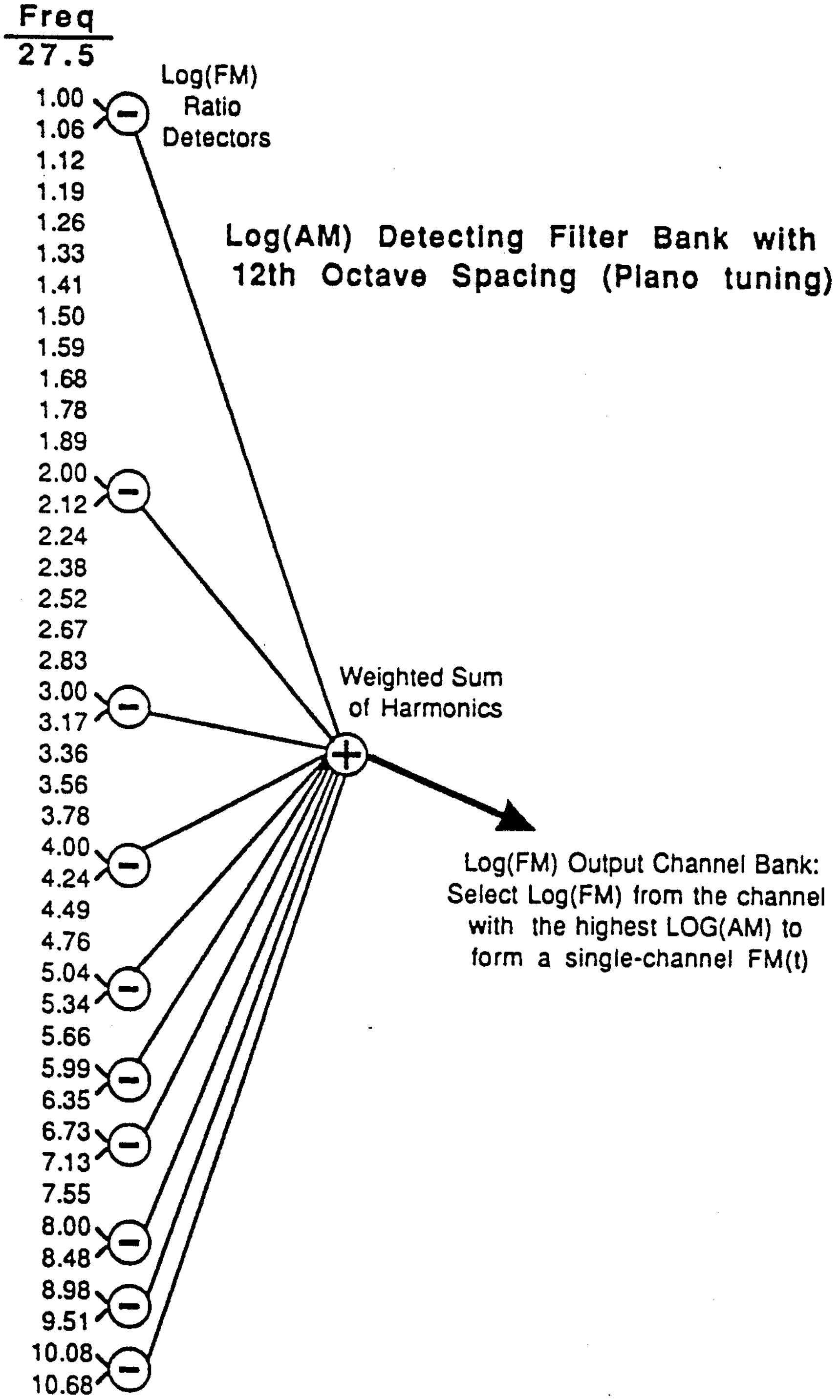
FIG. 5 illustrates combining log (instantaneous amplitude) detected outputs from a filter bank to form ratio detectors.

Thus, the invention operates on the principle that the ear is not a general purpose sound analyzer, but instead, is specifically designed for extracting information from amplitude and frequency modulated harmonics in sound. It was previously shown herein that a ratio-detecting filter-bank, built with filters having overlapping Gaussian frequency responses, can be designed to directly measure either the instantaneous frequencies of signals or the logarithms of instantaneous frequency ratios. The latter is the basis of this invention for processing speech signals, although the human auditory system may make use of the former outside of the frequency range of speech, particularly at lower frequencies. The filters in the filter-bank have a Gaussian response vs. log(frequency/R) where "R" is a fixed, reference frequency, and are centered at 1/12th octave intervals. This particular spacing is the same spacing employed by musicians in the equi-temperament tuning of pianos, and it is employed herein for the same reason that it is employed in piano tuning. Other spacings could be used, but this spacing clearly illustrates the importance of frequency spacing considerations. FIG. 5 illustrates how the log (instantaneous amplitude) detected outputs of a filter bank, such as that in FIG. 4, with 1/12 octave spacing may be combined to form ratio detectors and also illustrates how the log (instantaneous frequency) measurements from subsets of ratio detectors, tuned to harmonically related frequencies, may be averaged to yield a single, composite estimate of the fundamental frequency. This 1/12 octave filter center frequency spacing results in logarithmically spaced filters that are very closely centered at the frequencies of the linearly spaced harmonics and have bandwidths comparable to those that exist in the human auditory system.

This feature makes it particularly easy to form a weighted average (composite) of the FM extracted from individual harmonics, since the harmonics are always centered within filters that are at fixed offsets (number of filters) from each other. Consequently, there is no need to search or hunt for the harmonics. One may simply sum the outputs from an a priori known set of filters.

FIG. 5 depicts one such sum corresponding to the lowest fundamental note on a piano, centered on filter number 1. For speech, the lowest fundamental could be at a higher frequency, say 60 Hz. Sums of this form are computed for each filter in the filter-bank resulting in a set of outputs that encode the average FM response of all the harmonics up to the highest frequency represented by the filter-bank. In the case where only a single voice is present with no interfering tones, a single-channel FM vs. time function may be formed by simply selecting the FM measurement, at any given instant in time, from the summed channel response corresponding to the largest log(AM). In other words, the filter-bank computes the summed response for all the filters, even though most of the filters have no signals within their pass-bands. But given the a priori knowledge that a single voice produces only a single set of harmonics, only one summed ratio-detector response at a time can actually represent a signal, and that ratio-detector must correspond to the one with the greatest amplitude.

An important point is that, unlike more typical ratio-detectors that are based on band-pass filters with non-Gaussian response functions, for Gaussian filters, the calculation of the frequency is "exact", even when the signal's frequency is far outside the central pass-band of the filters forming the ratio detector. Consequently, the accuracy of the computed frequency only depends on the signal-to-noise ratio within the ratio-detector. It does not depend on an approximation formula that is only valid within the central region of the detector as is the case with more commonly used types of filters. This is important because it means that all the ratio-detectors tuned to frequencies anywhere near the signal frequency will correctly compute the signal frequency. Thus, when attempting to locate the detector with the highest amplitude in order to form a single channel FM signal, it does not matter that, due to noise, one may occasionally select a neighboring detector's estimate instead of the correct one. The neighboring ones will yield approximately the same frequency estimate.

This structure also provides all the inputs necessary for implementing a simple means for adaptively weighting the harmonic's FM measurements in order to form average FM measurements of signals in the presence of interfering signals, simultaneous signals and signals of differing durations. By exploiting the a priori knowledge that the primary signals of interest consist of a set of harmonics, the frequency estimates themselves can be used to weight the average. If a measured frequency within one of the channels contributing to a sum does not appear to be a precise harmonic (integer multiple of the fundamental) then it may be de-weighted to effectively exclude it from the sum. This can be illustrated by comparing the response of this measurement process with the known response of the ear to an input signal consisting of a set of harmonics (constant frequencies) with one of the harmonies being mis-tuned. The previously cited papers by Hartmann describe several such auditory function experiments conducted on human subjects. How well such a technique works depends on how accurately the system can estimate the frequencies within the individual channels. That is why the ability to greatly exceed the limitations imposed by the uncertainty principle is so important.

The accuracy with which a signal's various harmonic frequencies can be computed is a function of the signal-to-noise ration (SNR) for each harmonic and the duration of the harmonic. The SNR in turn depends on both the harmonic's amplitude and frequency, since the filter-bank's noise bandwidths are a function of frequency. Given the a priori known structure of the ratio-detecting filter-band, and estimates of the amplitude and frequency of each harmonic, it is possible to compute the probable error of the frequency estimates. The duration can be estimated from the amplitude measurements. This is all the information needed to dynamically weight the FM average such that the harmonics with the least error are most highly weighted. The reason that the duration of each harmonic affects the measurement accuracy is that filters with different bandwidths have impulse responses of differing durations, i.e., wide bandwidths result in short durations. If the duration that a signal persists within a ratio-detector is less than the duration of the detector's filters' impulse responses, the detector is unable to make an accurate measurement. But different harmonics will lie within ratio-detectors with differing impulse response durations. Thus, for the Hartmann mis-tuned harmonic tests, when a short duration signal first appears, the higher harmonics yield stable frequency estimates before the transients associated with the long duration impulse responses of the lower frequency channels have died out. But the higher harmonics lie within filters with larger noise bandwidths than the lower ones. Hence, although they yield stable measurements faster, they are less accurate than the measurements that will eventually be available from the lower harmonics. Consequently, the initial "acceptance gate" for determining whether or not a signal is sufficiently close to a harmonic frequency to be included in the sum would be based on the low accuracy, but first available frequency estimates from the higher harmonics. Hence, a slightly mis-tuned harmonic would initially lie within the comparatively wide acceptance gate (frequency uncertainty). But if the signal persisted long enough to yield stable measurements from the more accurately measurable lower harmonics, the acceptance gate would narrow and eventually reject the mis-tuned harmonic as not being sufficiently close to an integer multiple of the fundamental frequency. This is precisely the type of behavior observed by Hartmann (1990, page 1719): "A peculiar effect occurs when a mis-tuned harmonic experiment is run at short durations such as 50 ms. Listeners hear the mistuned harmonic segregated from the complex tone, but the mistuned harmonic emerges from the complex tone only after a delay. The effect is striking." This effect in the human ear, and many others described by Hartmann, appear to directly result from an information extraction process such as the one employed by the invention disclosed herein. Such an information extraction process differs drastically from conventional approaches.

Conventional approaches can be divided into two groups; (1) techniques that require as input, measurements of the signal itself, and (2) techniques which do not. The method of the invention does not require such inputs. For example, many of the first type of techniques for encoding speech information are based on linear prediction. A filter, usually implemented digitally, uses past measurements of the input signal's actual waveform to predict the value of future measurements. The predictions are then subtracted from the actual new measurements and only the difference is encoded. Such techniques will not work without the technology to measure the signal waveform in the first place. In contrast, the second type of techniques do not require such capabilities and thus, in some sense, are simpler to implement. For example, no technology exists for making direct measurements of the waveform of a signal at frequencies as high as those of visible light. Nevertheless, techniques like ratio-detectors can readily measure properties of the light such as its frequency (color) and amplitude. Thus, there is a fundamental difference in the complexity of the technologies required to implement the two types of techniques. The second type can be successful with much less sophisticated technology.

The second types of techniques may themselves be further sub-divided into two classes: (1) transform based approaches and (2) discriminator or tracking-filter approaches. Computing the complete transform, that is, both the amplitude and phase spectrum is an approach of the first type, since computing the transform requires measurements of the signal waveform as inputs. Here, however, we consider only the use of a transform for an efficient implementation of a filter bank. For example, a Fourier transform may be used to measure the distribution of signal power vs. frequency. Measuring power vs. frequency does not in general require the ability to measure the signal waveform. But measuring power vs frequency by means of a Fourier Transform does require the ability to measure the waveform first. Transform based approaches use coefficients produced by some type of transformation to encode speech information. The Fourier transform has long been used for speech analysis, and more recently, Cepstral and Wavelet transforms have been proposed. These transformers can be thought of as filter banks that measure the amplitude and phase spectrum of the signal, but do not exploit the a priori knowledge that individual harmonics are isolated in frequency. Consequently, they are all limited by the uncertainty principle. Without exploiting that a priori knowledge, it is not possible to achieve frequency measurement accuracies significantly better than the spacing of the filters in the transforms' filter banks. The frequency estimate is simply taken to be given by the filter or "place" that the signal occurs at within the transform. No such approach can account for the fact that, at typical signal-to-noise ratios, the human auditory system can readily detect frequency shifts as small as 1% of the spacing between its effective filters. Consequently, such approaches are not, by themselves, useful for extracting highly accurate frequency modulation information. However, the amplitude spectrum generated via a transform may, in some cases, be useful for synthesizing the outputs corresponding to a ratio-detecting filter bank.

The discriminator (frequency demodulator) and tracking filter approaches are most similar to the technique disclosed herein, but there are several fundamental differences that result in the invention being practical whereas none of the conventional approaches have ever been successfully used in extracting speech information from audio signals. Tracking filters may be either band-pass or band-stop in nature. Their distinguishing characteristic is that the center of a filter's operating bandwidth is not fixed in frequency. Instead, a feedback mechanism is used to cause the operating band to track the time-varying frequency of a signal. While such approaches have proven useful for tracking signals with only one carrier frequency, they have never been shown to be practical for accurately tracking modulated harmonics, much less multiple groups of harmonics produced by simultaneous talkers.

There are many practical problems with such an approach. These include the fact that on a linear frequency scale, the harmonics do not maintain a constant spacing between them, so they must be tracked individually. Furthermore, they have different bandwidths, so the bandwidths of the tracking filters must vary with frequency. Also, if they are tracked individually, several filters may tend to track a single harmonic, while ignoring other harmonics entirely. The invention disclosed herein requires no tracking whatsoever. The harmonics are always within known filter positions relative to the fundamental, so they can be measured and summed via an entirely static filter structure.

The Gaussian ratio-detecting filter bank is a form of frequency discriminator. There are many ways in which frequency discriminators can be built, and others have proposed such devices to process speech. Hartmann, for example, briefly considered a frequency discrimination process in connection with the mis-tuned harmonic experiment noted above. But except for the invention disclosed herein, all such approaches have encountered insurmountable problems. First, because speech consists of multiple carriers (harmonics), a single discriminator cannot be used, operating over the entire speech bandwidth. Second, unlike adjacent FM radio stations, the harmonics do not remain within permanently non-overlapping frequency bands. The frequency of the fifth harmonic may double and thus rapidly sweep through the former bands occupied by the sixth, seventh, eight, ninth and tenth harmonics. Since most types o discriminators function by estimating the frequency of a signal within their bandwidth, the position of that bandwidth in frequency must track, just as was the case for a tracking filter. Indeed, a tracking filter is simply one form of discriminator. Hence, any discriminator that employs an operating principle that requires the signal, and only one signal, to lie within its bandwidth will encounter all the same problems associated with tracking filters. Those of ordinary skill will further note that, rather than having the bandwidth of the discriminator track the signal, it is more common to operate the device at an intermediate frequency and use a tracking local oscillator to tune the signal to within the bandwidth of the discriminator.

A ratio-detector is the one form of discriminator that does not require the signal to be within the bandwidth of a single filter. The principle of operation of a ratio-detector is based on how a signal passes between adjacent filters rather than remaining within a single filter. Thus, it is better suited to measuring signals sweeping through a static filter bank. Even so, the classic forms of ratio detectors are ill-suited for processing speech harmonics. There are two primary reasons for this. First, because of the differing bandwidths of the harmonics, a ratio-detector for detecting the logarithm of a frequency ratio is required rather than one that detects the frequency itself. Second, classic ratio-detectors use filters, such as Butterworth filters, for which the frequency measurement process is only accurate if the signal remains in the central region between two adjacent filters. Inaccurate measurements occur as the signal passes form one ratio-detector to the next, unless they are highly overlapped, adding cost and complexity to the system. The invention herein eliminates all of these problems. Furthermore, only the log(AM) rather than AM itself is required as an input to the computation of log(FM) without having to first compute the FM and then take the log of it. This enables the entire operation to be carried out using technologies with a limited dynamic range. This result is highly significant to the understanding of the ear, but may be of less concern to a machine implementation given the recent progress in the development of wide dynamic range analog-to-digital converters available for digitizing speech, and wide dynamic range, floating-point digital signal processors.

There are many different ways in which the filters themselves could be fabricated, using either analog, digital or hybrid technologies, as will be known to those of ordinary skill. In FIGS. *6a* and *6b*, the results of a computer simulation of the process are shown. In this case, the filters were synthesized digitally, by weighting the amplitude spectrum produced by a Fast Fourier Transform (FFT). A spectrogram consisting of the successive amplitude spectrums of the speech is depicted in FIG. *6b*. FIG. *6b* is a conventional Fourier spectrogram of a few seconds of speech, comprising the sentence "Here's something we hope you'll really like!", as spoken by the popular cartoon character "Rocky the flying squirrel". On the lower left, the outputs of the individual ratio-detectors are depicted. FIG. *6a* illustrates both the speech waveform vs. time, and the log (instantaneous amplitude) and log (instantaneous frequency) detected outputs from a filterbank, such as that in FIG. 5. Log (frequency) is depicted along the vertical axis; note that there are 12 output channels plotted within each octave. Log (amplitude) is depicted by the intensity (darkness) of the output and time is depicted along the horizontal axis. The single-channel, composite log (frequency) 601, obtained by combining harmonically related log (frequency) outputs from the ratio detectors, as depicted in FIG. 5, is shown at the bottom of the figure, offset in frequency so that it is not plotted directly over the first harmonic (fundamental). Superimposed on the bottom of the ratio-detector outputs, the single-channel, composite log (FM) is obtained by summing the harmonic outputs and selecting the summed output corresponding to the largest amplitude. The identical nature of the frequency modulations of the harmonics and the resulting composite are clearly visible in the figure, as the harmonics sweep through the various channels of the ratio detecting filter bank. The horizontal grid lines are plotted on a logarithmic scale at integer multiples of 160 Hz.

Using the FFT approach is a convenient method for generating the simulation, but does not yield ideal frequency responses for the filters in the filter bank. The length of the FFT that was employed was too short to correctly construct the long impulse responses of the low frequency filters and too long to correctly low-pass filter the high frequency filters. These effects are most visible at the low frequency of the first harmonic. With filters that better approximate the ideal Gaussian response, the adjacent ratio detectors would all yield approximately the same frequency measurements, as can be observed for the higher harmonics when their signal-to-noise ratios are high. With the sub-optimal filters used to produce FIG. 5, small frequency offsets on the order of 10 Hz can be seen on the outputs from adjacent filters near the low frequency fundamental.

The log-amplitude (unattenuated by the filters) of a signal between the "j"th and "j−1" filters can be determined from the Amplitudes "A" of the filtered outputs:

$$ln(AM_j)=ln(_{j-1})+[0.5(ln(A_j)-ln(A_{j-1})+1)]^2$$

The log-frequency of a signal is similarly computed from the ln(A) outputs of the filters:

$$ln(FM_j)=\text{sigma}\ (K+j-1.5+0.5(ln(A_j)-ln(A_{j-1}))$$

Where K is a constant and K=ln(frequency of the first filter / reference frequency) / sigma, and sigma is a constant that determines the filter spacings and bandwidths, e.g., sigma=ln(2)/12.

The bandwidths of the log(FM) and the log (AM) of the harmonics can be clearly seen to be orders of magnitude smaller than the bandwidth of the signal waveform itself, since they are much more slowly varying. Consequently, a sampled version of these modulations requires far fewer data bits to encode them than would be required to encode the signal itself.

Further data compression could be obtained by applying virtually any of the standard waveform data compression techniques to the modulation waveforms. By directly extracting the modulations on speech signals, which are the only parts of the signals that are capable of conveying any information, this technique greatly reduces the amount of data that must be processed while still preserving the information. A concise representation of the information content of speech will also be extremely valuable for applications such as the machine recognition of speech and speech understanding.

The block diagram of the invention in FIG. 7 depicts a "piano tuned", ratio detecting filter-bank which precisely measures the log (instantaneous amplitude) and log (instantaneous frequency) of all the signals within the passband of the device. The tuning of the filter-bank itself, together with the log (frequency) measurements, are then used to determine which signals are harmonically related, and the log (frequency) measurements of these signals are averaged to remove the "frequency diversity" characteristic of any speech signal that may be present. The large amplitude obtained by combining the power from all the harmonics is then used to identify the ratio-detectors containing the strongest signals.

Speech signals sweeping in frequency (multiplexing) across the filter-bank are then demultiplexed into single-channel log (AM) and log (FM) outputs by extracting the log (FM) from the channels with the greatest power and the log (AM) from the channels that are harmonically related to the extracted log (FM).

Following speech data compression, the speech may be reconstructed by modulating a set of harmonics with the extracted FM and AM waveforms. In FIG. 7, the input speech signal 701 is fed into a set of narrowband AM and FM demodulators 703, each tuned to a different frequency bands. The outputs from these demodulators are then harmonically combined in harmonic signal combiners 705. These outputs were plotted in FIG. 6*a*. That is, the demodulators are tuned in such a way that certain subsets of the demodulators will always exist such that the center-frequencies of the demodulators in each subset are very nearly exact integer multiples of harmonics of the first or lowest frequency demodulator in the subset; Harmonically related AM & FM outputs are combined from only those demodulators within a given subset, depicted as H1, H2 . . . H10 in the figure. At any one instant in time, all of the input speech power, due to the harmonics, will be concentrated into a single channel of the multi-channel signal combiner's outputs. Similarly, the instantaneous frequency of all the speech harmonics is represented by the FM output from the same channel. However, since the frequency of the fundamental changes as a function of time, the channel containing the combined AM & FM signals are multiplexed across the numerous output channels of the signal combiner. The frequency of the fundamental vs. time, FM(t), and the amplitude of each Harmonic vs. time, AM(t) H1, . . . AM(t)) H10, can thus be reconstructed by demultiplexing the harmonically combined AM & FM signals in demultiplexer 707. At any given instant in time, FM(t) is set equal to the F input from the channel with the greatest signal amplitude (AM). The composite FM(t) depicted in FIG. 6*a* was constructed via this method. The AM(t) for each harmonic is similarly derived from the amplitude measurements from the two AM detectors making up the ratio detectors (FM demodulators) most closely tuned to the frequencies of the harmonics (possibly "weighted" by the same weights used in signal combining, to reduce interference, etc.).

While the preferred embodiments of the invention have been shown and described, it will be apparent to those of ordinary skill that various changes and modifications can be made herein without departing from the scope of the invention as defined in the appended claims.

What is claimed is:

1. A method of extracting information content from speech, the method comprising the steps of:

(a) receiving a speech signal into a receiver having a plurality of individual bandpass filters, said bandpass filters, taken together, spanning the frequency range of a human voice;

(b) determining instantaneous amplitude modulation, AM(t), of each harmonic in speech signal waveforms from outputs of said bandpass filters;

(c) determining instantaneous frequency modulation, FM(t), of each harmonic in said speech signal waveforms from outputs of said bandpass filters to within an accuracy of frequency separation between adjacent said bandpass filters to provide speech signal recognition;

(d) determining a logarithm of an instantaneous frequency of a speech fundamental frequency by computing a weighted average of logarithms of said FM(t) from each measured harmonic, after subtracting the logarithm of the harmonic number from each said log (FM(t));

(e) forming output signals for an output device, said signals having the logarithm of the instantaneous frequency of said speech signal fundamental frequency obtained in step (d) and the logarithms of sid AM(t) obtained in step (b), for a plurality of lowest frequency speech harmonics.

2. The method recited in claim 1, wherein said filters have center frequencies such that predetermined subsets of filters form AM and FM detectors centered at frequencies which are about equal to exact integer multiples of a lowest center frequency detector in each subset, and wherein the detectors in each subset are harmonically tuned.

3. The method recited in claim 2, further comprising the step of selecting a subset of FM detector outputs for combining in step d.

4. The method recited in claim 3, wherein a weighted summation is performed in determining said weighted average, and wherein weighting of said summation is a function of the signal-to-noise ratio of signals within each FM detector.

5. The method recited in claim 3, wherein a weighted summation is performed in determining said weighted average, and wherein weighting of said summation is a function of a difference, computed in a feedback process, between a computed output frequency, FM(t), of each harmonic and a corresponding expected integer multiple of a fundamental frequency.

6. The method recited in claim 3, wherein a single composite log (FM(t)) of a speech fundamental is constructed by demultiplexing said FM outputs from all of said FM detectors.

7. The method recited in claim 6, wherein, at each instant of time, said demultiplexing of said speech fundamental is accomplished by power combining a weighted sum of AM detected signals within said filters comprising said subset and selecting the log (FM(t)) from said subset yielding the greatest power.

8. The method recited in claim 7 wherein for multiple, simultaneous speech sources, a plurality of filter outputs is selected, said outputs corresponding to subsets with greatest power, to construct multiple composite speech fundamental frequencies.

9. The method recited in claim 2, wherein the center frequencies of said filters are separated by 1/12th of an octave.

10. The method recited in claim 1, wherein said output logarithms of AM(t) for each harmonic are derived from demultiplexing and combining said AM detected filter outputs from filters centered at about integer multiples of said composite fundamental frequency.

11. The method recited in claim 1, wherein said FM(t) are determined by a ratio detector.

12. The method recited in claim 11, wherein said bandpass filters have frequency responses that are Gaussian on a linear frequency axis, with center frequencies and bandwidths such that a ratio detector computation of FM(t) is determined from a linear function of a difference between said logarithms of said outputs from two adjacent AM detected filters.

13. The method recited in claim 12, wherein spacing of said Gaussian filters on of one a frequency axis and a logarithmic frequency axis equals a standard deviation of said Gaussian function.

14. The method recited in claim 11, wherein said individual bandpass filters have log-frequency responses which are Gaussian on a logarithmic frequency axis, with center frequencies and bandwidths such that the ratio detector computation of log (FM(t)) may be determined from a linear function of a difference between said logarithms of said outputs from two adjacent AM detected filters.

15. The method recited in claim 14, wherein the spacing of the Gaussian filters of the frequency or logarithmic frequency axis equals the standard deviation of the Gaussian function.

16. The method recited in claim 1 wherein the step of determining the instantaneous frequency modulation to within an accuracy required for speech recognition comprises determining said accuracy to within ±10% of the frequency separation between adjacent filters, 17. The method recited in claim 1 wherein said plurality of lowest frequency speech harmonics comprises any of the ten lowest frequency harmonics of a fundamental frequency.

18. A method of compressing speech signals, the method comprising applying the speech signals to a plurality of bandpass filters and sampling log (FM(t)) output and log (AM(t)) output of said bandpass filters at low sampling frequencies, thereby encoding information content in said speech into low bit-rate, low dynamic range, digitized signals.

19. A method of reconstructing a speech waveform, the method comprising the steps of :

synthesizing a set of harmonically spaced audio carrier tones, and modulating said tones with FM and AM outputs, said FM and AM outputs being determined by:

determining instantaneous amplitude modulation, AM(t), of each harmonic in a speech waveform from outputs of a plurality of bandpass filters spanning the range of human speech;

determining instantaneous frequency modulation, FM(t), of each harmonic in speech waveforms from outputs of said bandpass filters to within an accuracy of frequency separation between adjacent said bandpass filters to provide speech recognition;

determining a logarithm of an instantaneous frequency of a speech fundamental frequency by computing a weighted average of logarithms of said FM(t) from each measured harmonic, after subtracting the logarithm of the harmonic number from each said log (FM(t));

forming output signals by summing the synthesized, modulated tones for a plurality of lowest frequency speech harmonics. comprises any of the ten lowest frequency harmonics of a fundamental frequency.

20. An apparatus for extracting information content from speech, the apparatus comprising:

(a) a receiver arranged to receive a speech signal, said receiver having a plurality of individual filters with adjacent filters having center frequencies separated by a predetermined ratio of frequency;

(b) means for measuring frequency characteristics of said speech signal by determining differences in signal amplitudes detected in said adjacent filters;

(c) an adder, said adder being configured to sum predetermined sets of said differences into a sum, each said set comprising differences in signal amplitudes in frequency ranges including only harmonics of fundamental frequencies; and (d) means for forming an output signal from said sum.

21. The apparatus recited in claim 20, wherein said means for determining differences comprises a subtractor, said subtractor being configured to subtract logarithms of signal amplitudes in said adjacent filters.

22. The apparatus recited in claim 21 further comprising means for determining an average value of signal amplitudes in each said filter.

23. The apparatus recited in claim 22 wherein said filters have a Gaussian response vs. log (frequency/R), where R is a reference frequency.

24. The apparatus recited in claim 20 wherein each said filter has a Gaussian frequency response.

25. The apparatus recited in claim 20 wherein said filters are logarithmically spaced in frequency and are centered close to frequencies of linearly spaced harmonics and have bandwidths comparable to bandwidths known to exist in the human auditory system.

26. The apparatus recited in claim 20 wherein said filters have center frequencies spaced at intervals of about 1/12 octave.

27. The apparatus recited in claim 20 wherein said individual filters form a filter bank covering known frequencies of human speech.

28. An apparatus for extracting information from speech signals, the apparatus comprising:

(a) a receiver arranged to receive a speech signal;

(b) a filter bank having a plurality of filters to sort said speech signal into a plurality of frequency bands;

(c) means for detecting amplitudes of frequencies in said frequency bands and selecting a band with highest amplitude;

(d) means for selecting frequency bands including harmonic frequencies of said band with the highest amplitude; and (e) an adder arranged to sum the amplitudes of said frequency bands including said harmonic frequencies.

29. An apparatus for extracting information content from speech, comprising:

(a) means for receiving a speech signal into a plurality of individual bandpass filters, said bandpass filters, taken together, spanning the frequency range of a human voice;

(b) means for determining instantaneous amplitude modulation, AM(t), of each harmonic in speech waveforms from outputs of said bandpass filters;

(c) means for determining instantaneous frequency modulation, FM(t), of each harmonic in said speech waveforms from outputs of said bandpass filters to within an accuracy of frequency separation between adjacent said bandpass filters to provide speech recognition;

(d) means for determining a logarithm of an instantaneous frequency of a speech fundamental frequency by computing a weighted average of logarithms of said FM(t) from each measured harmonic, after subtracting the logarithm of the harmonic number from each said log (FM(t));

(e) means for forming output signals having the logarithm of the instantaneous frequency of the speech fundamental frequency obtained in step (d), and the logarithms of the AM(t) obtained in step (b), for a plurality of the lowest frequency speech harmonics.

30. A method of extracting information content from an information carrying signal composed of a plurality of modulated harmonically related carrier tones, the method comprising the steps of:

(a) receiving said information carrying signal into a receiver having a plurality of individual bandpass filters, said bandpass filters, taken together, spanning a predetermined frequency range of said information carrying signal;

(b) determining instantaneous amplitude modulation, AM(t), of each harmonic in information signal waveforms from outputs of said bandpass filters;

(c) determining instantaneous frequency modulation, FM(t), of each harmonic in said information signal waveforms from outputs of said bandpass filters to within an accuracy of frequency separation between adjacent said bandpass filters to provide information recognition;

(d) determining a logarithm of an instantaneous frequency of an information signal fundamental frequency by computing a weighted average of logarithms of said FM(t) from each measured harmonic, after subtracting the logarithm of the harmonic number from each said log (FM(t));

(e) forming output signals for an output device, said signals having the logarithm of the instantaneous frequency of said information signal fundamental frequency obtained in step (d) and the logarithms f said AM(t) obtained in step (b), for a plurality of lowest frequency information signal harmonics.

31. The method recited in claim 30, wherein said FM(t) are determined by a ratio detector.

32. The method recited in claim 31 wherein said individual bandpass filters have log-frequency responses which are Gaussian on a logarithmic frequency axis, with center frequencies and bandwidths such that the ratio detector computation of log (FM(t)) may be determined from a linear function of a difference between said logarithms of said outputs from two adjacent AM detected filters.

33. An apparatus for extracting information content from an information carrying signal composed of a plurality of modulated harmonically related carrier tones, the apparatus comprising:

(a) a receiver arranged to receive said information carrying signal, said receiver having a plurality of individual filters with adjacent filters having center frequencies separated by a predetermined ratio of frequency;

(b) means for measuring frequency characteristics of said information carrying signal by determining differences in signal amplitudes detected in said adjacent filters;

(c) an adder, said adder being configured to sum predetermined sets of said differences into a sum, each said set comprising differences in signal amplitudes in frequency ranges including only harmonics of fundamental frequencies; and (d) means for forming an output signal from said sum for use by an output device.

* * * * *